(12) United States Patent
Yoon et al.

(10) Patent No.: US 6,384,477 B2
(45) Date of Patent: *May 7, 2002

(54) MULTIPLE LINE GRID ARRAY PACKAGE

(75) Inventors: Chong Kwang Yoon, Kyoungki-do; Chan Keun Kim, Seoul, both of (KR)

(73) Assignee: Glotech Inc., Seocho-ku (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,196

(22) Filed: Nov. 30, 1998

Related U.S. Application Data

(63) Continuation-in-part of application No. 09/065,882, filed on Apr. 24, 1998, now abandoned.

(30) Foreign Application Priority Data

Apr. 26, 1997 (KR) .............................. 97-15770

(51) Int. Cl.[7] .......................... H01L 23/49; H01L 23/48
(52) U.S. Cl. ......................... 257/697; 257/692
(58) Field of Search ................. 257/685, 686, 257/690, 691, 693, 697, 700, 701, 735, 737, 748, 774, 773; 438/108, 123, 125, 611

(56) References Cited

U.S. PATENT DOCUMENTS

| | | | |
|---|---|---|---|
| 4,616,406 A | * 10/1986 | Brown | ........................ 29/558 |
| 4,654,472 A | 3/1987 | Goldfarb | |
| 5,283,717 A | * 2/1994 | Hundt | ........................ 361/813 |
| 5,541,449 A | * 7/1996 | Crane | ........................ 257/697 |
| 6,016,852 A | * 1/2000 | Mallik et al. | ............. 140/71 R |

FOREIGN PATENT DOCUMENTS

EP 0467698 1/1992

OTHER PUBLICATIONS

Patent Abstracts of Japan, vol. 13, No. 186 (E–752), May 2, 1989 & JP 01 012564A (NEC Corp.), Jan. 17, 1989.

* cited by examiner

*Primary Examiner*—Mary Wilczewski

(57) ABSTRACT

A multiple line grid array package comprising a package body having a first surface and a second surface opposite to the first surface; a first pattern formed on the first surface of the package body and including a number of input/output nodes; a second pattern formed on the second surface of the package body; and a multiple line grid having a nonconductive grid body and a number of conductors formed parallel to a longitudinal axis of the nonconductive grid body on the outer peripheral portion and/or within an inner portion of the multiple line grid and bonded to the package body; wherein each of the conductors is electrically isolated from each other and matches the corresponding one of the number of input/output nodes of the first pattern. A number of such multiple line grids are arranged in a grid pattern to form the multiple line grid array.

35 Claims, 10 Drawing Sheets

MULTIPLE LINE GRID ARRAY PACKAGE

This application is a continuation-in-part of U.S. patent application Ser. No. 09/065,882, filed on Apr. 24, 1998 now abandoned, entitled MULTIPLE LINE GRID ARRAY PACKAGE AND METHOD OF MANUFACTURING THE SAME and from which priority is claimed under 35USC §120.

BACKGROUND OF THE INVENTION

1. Field of the Invention

The present invention relates to a multiple line grid array package (MLGA package) and more particularly, to the multiple line grid array package having a package body with electrical circuit patterns according to specific design rules, on which a semiconductor chip is equipped and input/output nodes for supplying electrical signals to the semiconductor chip are exposed, and multiple line grids which electrically connect the input/output nodes with an external device.

2. Related Art

Generally, a ceramic pin grid array package (PGA) includes a multilayer ceramic structure which is formed by a desired process, and cylindrical metallic lead pins which are attached on the multilayer ceramic structure.

FIGS. 1A to 1C show an example of a conventional ceramic package which has the structure as described above.

As shown in FIG. 1A, there is provided a multilayer ceramic structure (package body 1) which is comprised of, for example, four ceramic layers 1a, 1b, 1c, 1d. Here, a first ceramic layer 1a located at the very bottom of the four ceramic layers is a dummy layer, and at the center portion of a second ceramic layer 1b is mounted a semiconductor chip 2. First electrode lines 4a are printed around the semiconductor chip 2 on the upper face of the second ceramic layer 1b for transferring electrical signals to each part of the semiconductor chip 2.

A third ceramic layer 1c is provided with a first cavity (not shown) which has a size capable of accommodating the semiconductor chip 2. Second electrode lines 4b are printed around the first cavity on the upper face of the third ceramic layer 1c. A fourth ceramic layer 1d is also provided with a second cavity which has a size capable of accommodating the semiconductor chip 2.

Around the second cavity 3 on the upper face of the fourth ceramic layer 1d, there are a plurality of input/output nodes 6 aligned apart from each other at regular intervals.

In addition, a plurality of via holes (not shown) for electrically connecting the respective input/output nodes 6 with the corresponding first and second electrode lines 4a, 4b are formed in the second, third and fourth ceramic layers 1b, 1c, 1d. The via holes are filled with conductive paste.

In FIG. 1A, there are shown upper portions 5 of the via holes filled with the conductive paste. Therefore, when the electrical signals are transferred to the input/output nodes 6, the electrical signals are continuously transferred through the first and second electrode lines 4a, 4b to terminals in the semiconductor chip 2.

Lead pins 7 for transferring the electrical signals are bonded to the package body 1. The lead pins 7 are typically made of a metal, and are formed into cylindrical pins. Furthermore, each of the lead pins 7 is connected with each of the corresponding input/output nodes 6.

FIG. 1B is a partially enlarged view of the package body 1 in FIG. 1A. The lead pins 7 are bonded to the corresponding input/output nodes 6 by brazing 7a.

FIG. 1C is a cross-sectional view along the line C–C' of FIG. 1B. The plurality of via holes are formed in the package body 1, and the via holes are filled with the conductive paste T. The respective ceramic layers 1a, 1b, 1c, 1d composing the package body 1 are provided with the first and second electrode lines 4a, 4b which are printed on the upper face of the ceramic layers 1a, 1b, 1c, 1d. The ceramic layers 1a, 1b, 1c, 1d are laminated to each other by pressure, followed by firing at high temperatures.

However, in the conventional pin grid array package as mentioned above, there are some problems as follows:

First, since the lead pins 7 are respectively connected with the corresponding input/output nodes 6 on the upper face of the ceramic package body 1, it is required that the number of the lead pins 7 should be as many in number as the input/output nodes 6. Therefore, as the integration density of the semiconductor chip increases, the number of the input/output nodes 6 likewise increases.

Such increase in the number of nodes and pins in the semiconductor chip causes the manufacturing cost of the ceramic package to increase, and the size of the package is also increased.

SUMMARY OF THE INVENTION

It is therefore an object of the present invention to provide a multiple line grid array package in which the manufacturing cost and the size thereof can be decreased.

One of the above objects which will be apparent to one skilled in the art upon a reading of this disclosure are attained by:

A multiple line grid array package comprising a package body on which a semiconductor chip is mounted and input/output nodes for supplying a electrical signal to the semiconductor chip are exposed, a multiple line grid for electrically connecting the input/output nodes of the package body with an external device is characterized in that a number of conductors are formed parallel to an axis on the outer side or interior of the multiple line grid, and that the conductors are bonded to the respective unit input/output nodes corresponding to each other.

The package body has electrical circuit patterns and includes a nonconductive substrate such as a polymer, a ceramic, or a polymer-ceramic composite, a number of wire bond pads, input/output nodes and electrode lines. If necessary, the package body further includes via hole pads. A number of electrode lines may be located between the multiple line grid and the adjacent multiple line grid on the upper surface of the package body. Alternatively, no electrode line may be located between the two adjacent multiple line grids. The via hole pads may also be located in the inside and/or outside of the areas where the multiple line grids are to be attached. The input/output node has various shapes and various sizes depending on the shape and size of the multiple line grid.

The multiple line grid made of a conductive material and a nonconductive material may be formed into one of a rectangular disc, a circular disc, a cylindrical shape, and elliptical cylinder and a hexahedron, etc., and the height of the multiple line grid is formed to be longer or shorter than its width.

According to the present invention, one multiple line grid can be connected with a number of the input/output nodes, whereby the number of lead pins can be reduced considerably.

In addition, according to the pattern of the present invention, a number of the input/output nodes are arranged within small area and the signal delivery delay is prevented due to the reduction of the length of the electrode lines.

BRIEF DESCRIPTION OF THE DRAWINGS

The above object, and other features and advantages of the present invention will be more apparent after a reading of the following detailed description taken in conjunction with the drawings, in which:

FIG. 1A is an exploded perspective view of a conventional pin grid array package; FIG. 1B is a partial perspective view of FIG. 1A; and FIG. 1C is a cross-sectional view taken along a line C–C' of FIG. 1B;

DETAILED DESCRIPTION OF THE PREFERRED EMBODIMENT

Figure 1A:
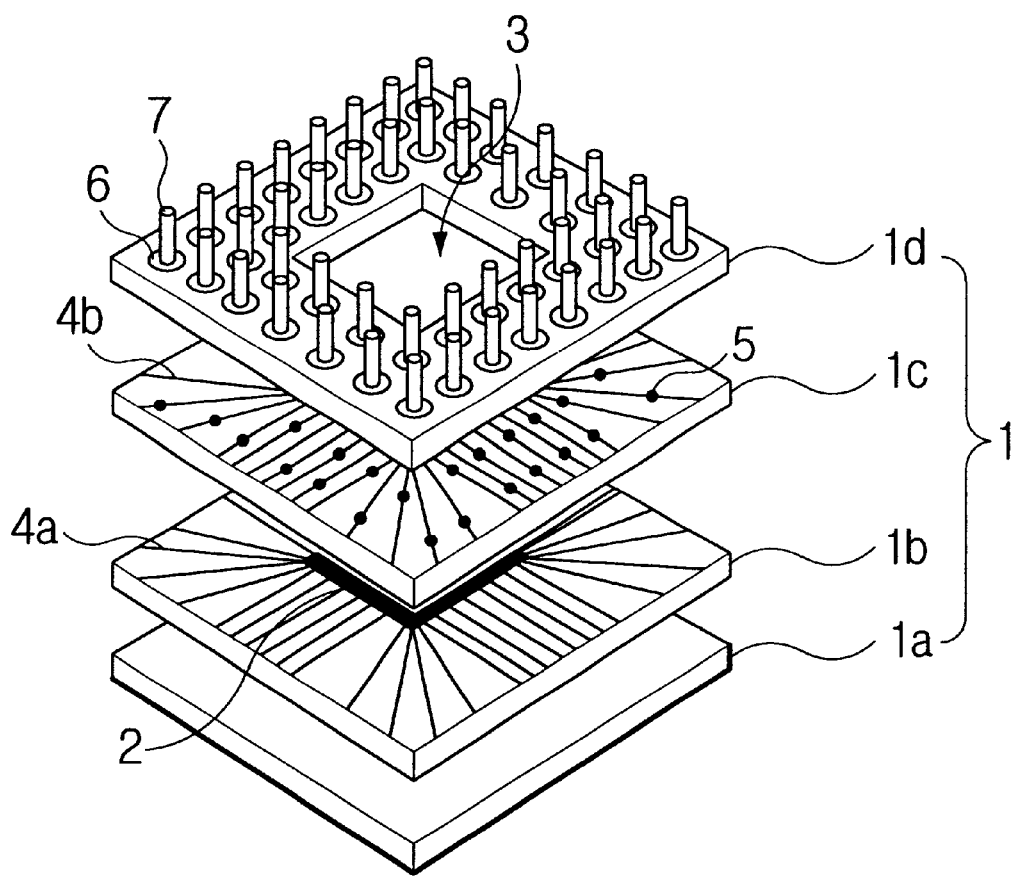
FIGS. 1A to 1C are one example of prior art of a pin grid array package.
Figure 1B:
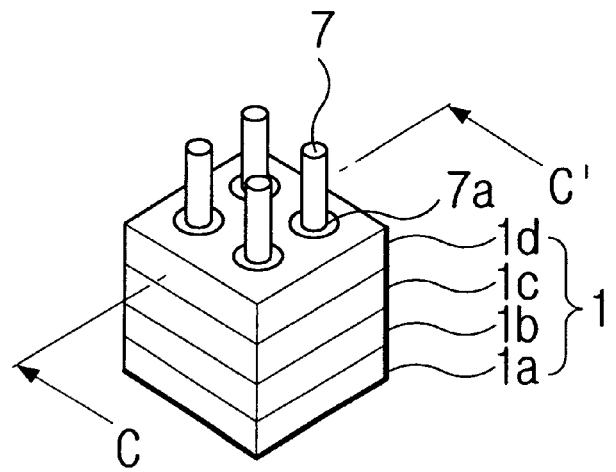
Figure 1C:
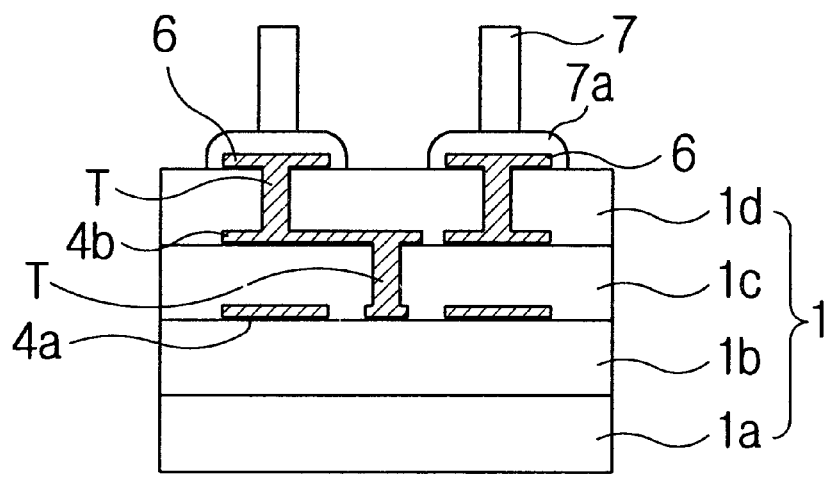

Referring now to FIGS. 1 to 6, there are illustrated embodiments of the present invention.

As shown in FIGS. 2 to 6c, a reference numeral 9 designates a nonconductive body of various types of multiple line grids, and 10a is a conductor on the outer surface or interior of the body 9, and 11 is a multiple line grid comprising the nonconductive body 9 with a flat end surface and the conductor 10a. In addition reference numerals 20a, 20b, 20c, 20d designate the package layers which include metallic electrode lines and electrical contacts on ceramic layers or plastic layers, 20 is a package body which includes the package layers 20a, 20b, 20c, 20d stacked and electrically connected to each other, and 21 is a cavity if need in which a semiconductor chip is to be located, and 22 is an input/output node which is arranged on the upper face of the package body, and 23 is a solder provided on each of the input/output node 22.

In the present invention, a semiconductor package in which a plurality of input/output nodes 22 are each connected with each conductor in the multiple line grids, which can reduce the number of lead pins and the size of the package is called "multiple line grid array package".

Figure 2:
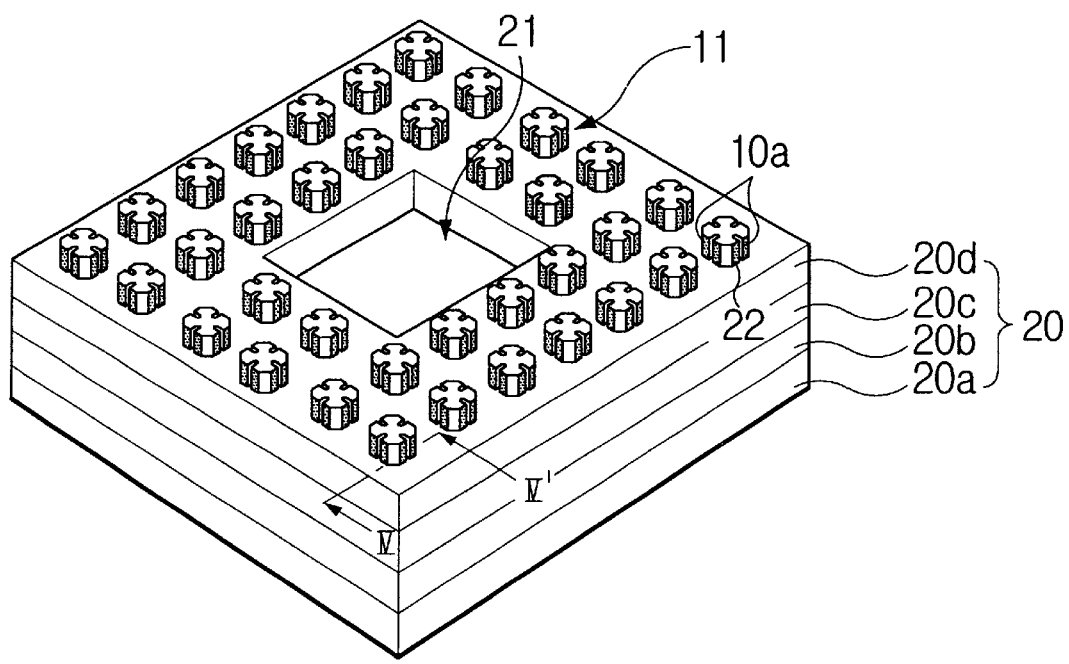
FIG. 2 is a schematic perspective view of one type of multiple line grid array packages applicable according to the present invention.

Referring to FIG. 2, the multiple line grid array package is described in the below.

The body 20 of the multiple line grid array package has a structure of stacking up and down a number of, for example, four package layers 20a, 20b, 20c, 20d. The input/output nodes 22 are exposed on the surface of the most upper package layer 20d, and are electrically connected with lower corresponding first and second electrode lines (not shown) in via contact manner. The package body 20 includes metallic electrode lines and electrical contacts on ceramic and/or plastic materials.

At the center of the package body 20, there is, if necessary, provided a cavity 21 in which a semiconductor chip is to be located. However, the semiconductor chip may be located in other types different from FIG. 2. The multiple line grids 11 of the present embodiment are attached to input/output nodes 22, and receive the electrical signals from an external device (not shown). Each of the multiple line grids 11 is attached to a number of input/output nodes 22 by soldering process which is cheaper than brazing process. That is, for example, the multiple line grid 11 in the present embodiment connects a number of, for example, eight input/output nodes 22.

Figure 3A:
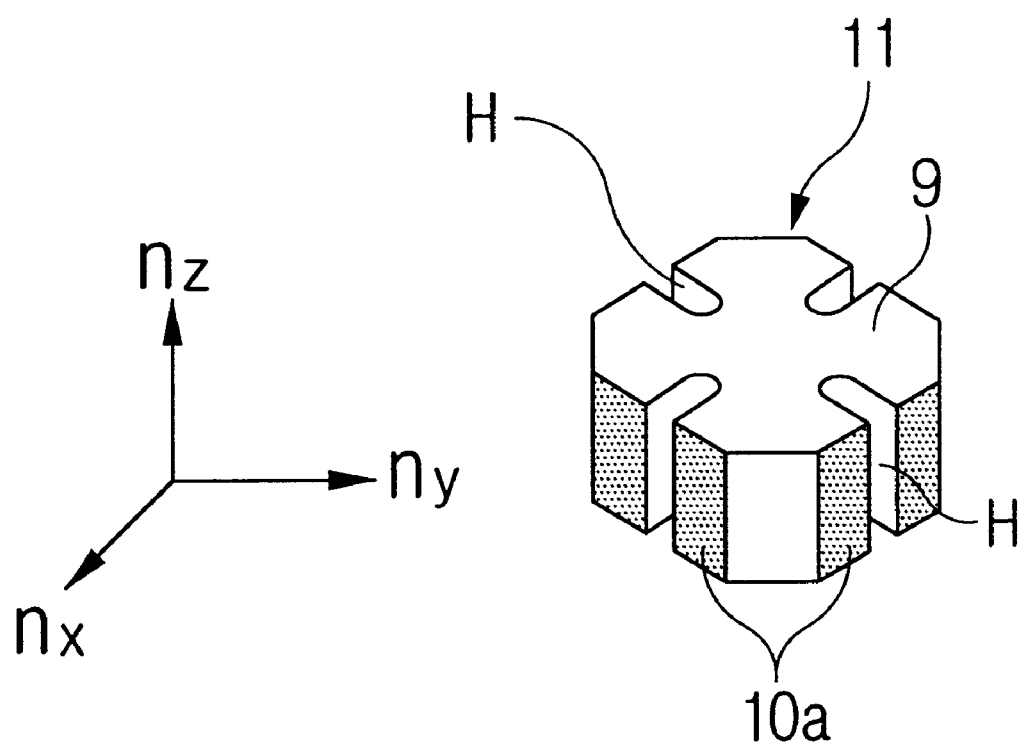
FIGS. 3A and 3B are partially enlarged perspective views of multiple line grids of the multiple line grid array package of FIG. 2.
Figure 3B:
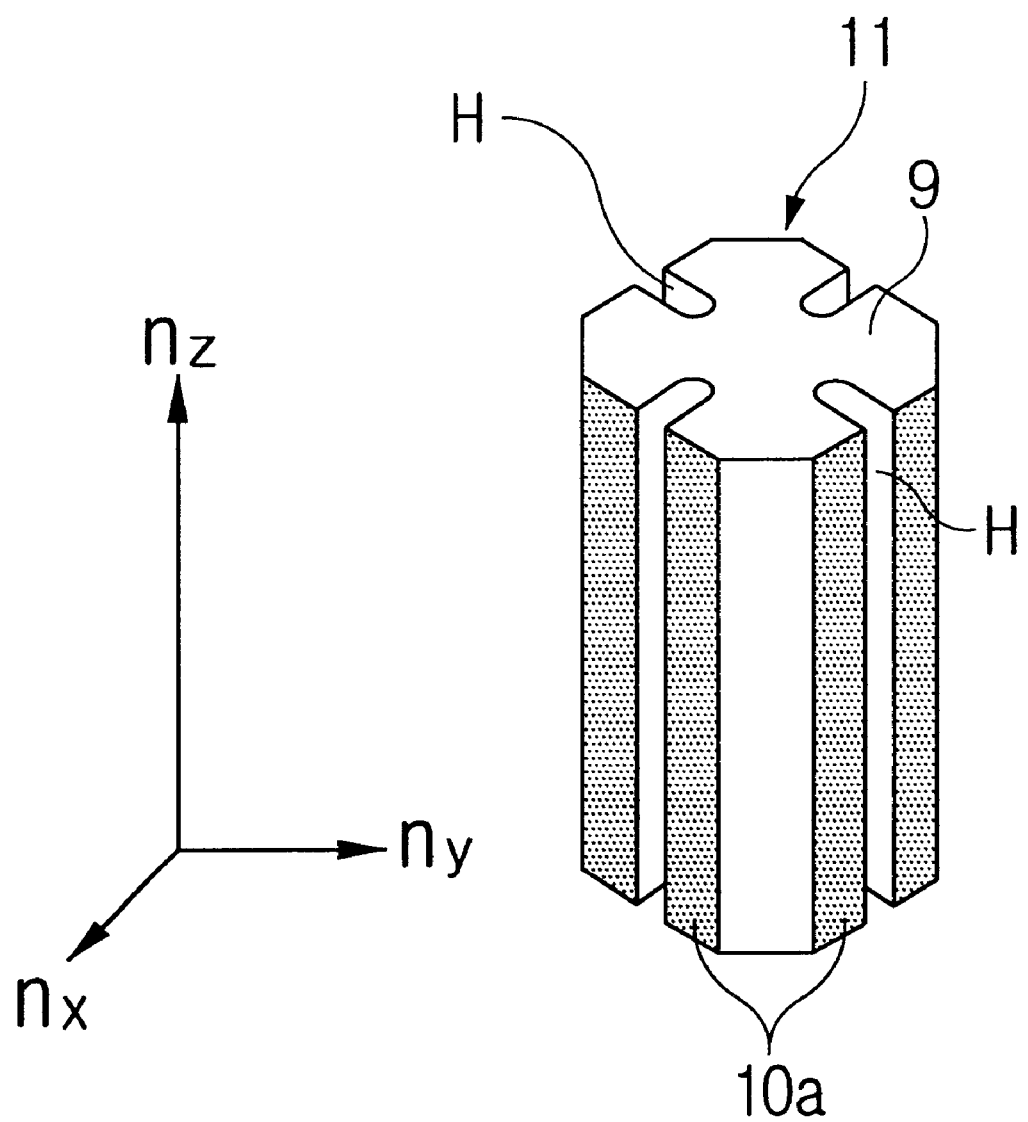
Figure 3C:
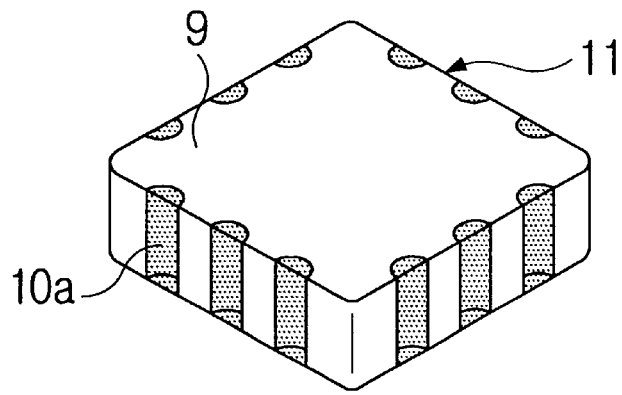
FIGS. 3C to 3E are other embodiments of multiple line grids which are to be applicable to the multiple line grid array package of FIG. 2.
Figure 3D:
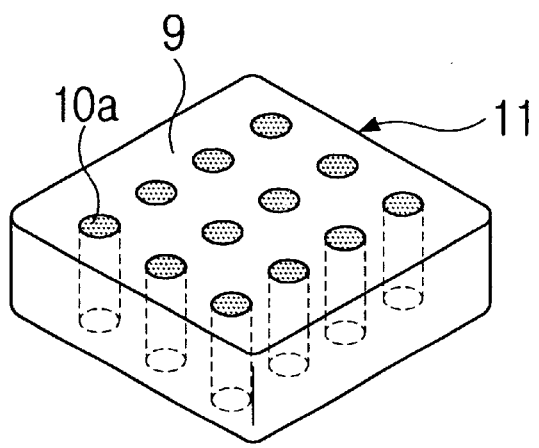
Figure 3E:
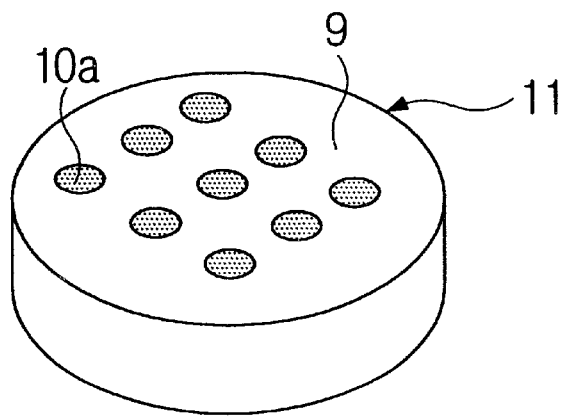

Referring to FIGS. 3A and 3E, the structure of the multiple line grid of the present invention is described more clearly in the below.

As shown in FIG. 3A, one of the multiple line grids used in the multiple grid array package of the present invention is a rectangular type.

The multiple line grid 11 includes a plurality of conductors 10a, a plurality of grooves H and a grid body 9. On each of the outer sides of the multiple line grid 11, a plurality of grooves H are formed parallel to the longitudinal direction of the multiple line grid 11. The conductor 10a is provided on the outer sides between the adjacent grooves H to facilely transfer the electrical signal. Preferably, the inner portion of the multiple line grid 11, that is, a grid body 9 is formed of nonconductive materials such as ceramic, polymer, a composite of ceramics and polymers, and silicon. Furthermore, in this embodiment, four grooves are formed on the outer sides of the multiple line grid 11 at regular intervals.

In addition, the multiple line grid 11 can be various forms according to an aspect ratio which is the ratio of a width $n_x$, $n_y$ to a height $n_z$ of the multiple line grid 11. Therefore, in the multiple line grid array package of the present invention, the multiple line grid 11 may be formed into a rectangular disc type of which the width $n_x$, $n_y$ is relatively longer than the height $n_z$ as shown in FIG. 3A. Alternatively, the multiple line grid 11 may be formed into a rod type in which the width $n_x$, $n_y$ is relatively shorter than the height $n_z$ as shown in FIG. 3B.

Furthermore, the multiple line grid 11 may be formed into other types instead of the rectangular disc or rod type described above.

FIGS. 3C to 3E are enlarged perspective views which show other embodiments of multiple line grid 11 which are applicable to the multiple line grid array packages according to this invention.

Multiple line grids comprising a nonconductive grid body 9 and conductors 10a of disc type are shown in FIGS. 3C to 3E. In FIG. 3C, a number of conductors 10a of semi-circular cylinder shape are formed parallel to the longitudinal direction of the multiple line grid 11 at a peripheral portion of the nonconductive grid body 9. The number of conductors are electrically isolated with each other. In FIG. 3D, a number of conductors 10a of circular cylinder shape are formed within the nonconductive grid body 9 with the number of conductors 10a being electrically isolated with each other. In FIG. 3E, a multiple line grid 11 is shown where a number of conductors 10a of a circular cylinder shape are formed within a nonconductive grid body 9 of a circular disc shape. The number of conductors 10a are also electrically isolated with each other.

The conductors 10a shown in FIGS. 3C to 3E are formed such that both top and bottom faces thereof are protruded a little more than both top and bottom surfaces of the grid body 9. As a result, the multiple line grid 11 is attached to the package body 20 such that each of the protruded portions matches the corresponding unit input/output node 22 (refer to FIG. 4). It is, of course, contemplated that the nonconductive grid body and the conductor may be modified to other various shapes. Some examples of the grid body and the conductor shown in FIGS. 3A to 3E are not limited, but illustrative.

According to the present invention, each of the conductors 10a coated with the conductive material or located with the interior of the multiple line grid body shown FIGS. 3A to 3E serves as a plurality of lead pins in a conventional sense. Therefore, one multiple line grid 11 includes a number of I/O paths according to the number of the conductors 10a and can be thus connected with a number of input/output nodes.

For example, the multiple line grid 11 of the rectangular disc type has eight conductors 10a as shown in FIG. 3A. Eight input/output nodes are connected with one multiple line grid 11, whereby the number of the lead pins which are used in the conventional BGA, and PGA packages can be reduced to one-eighth and the surface area thereof can be also reduced to below one-fourth. In addition, in FIGS. 3B to 3E, the same concept is applied.

Figure 4:
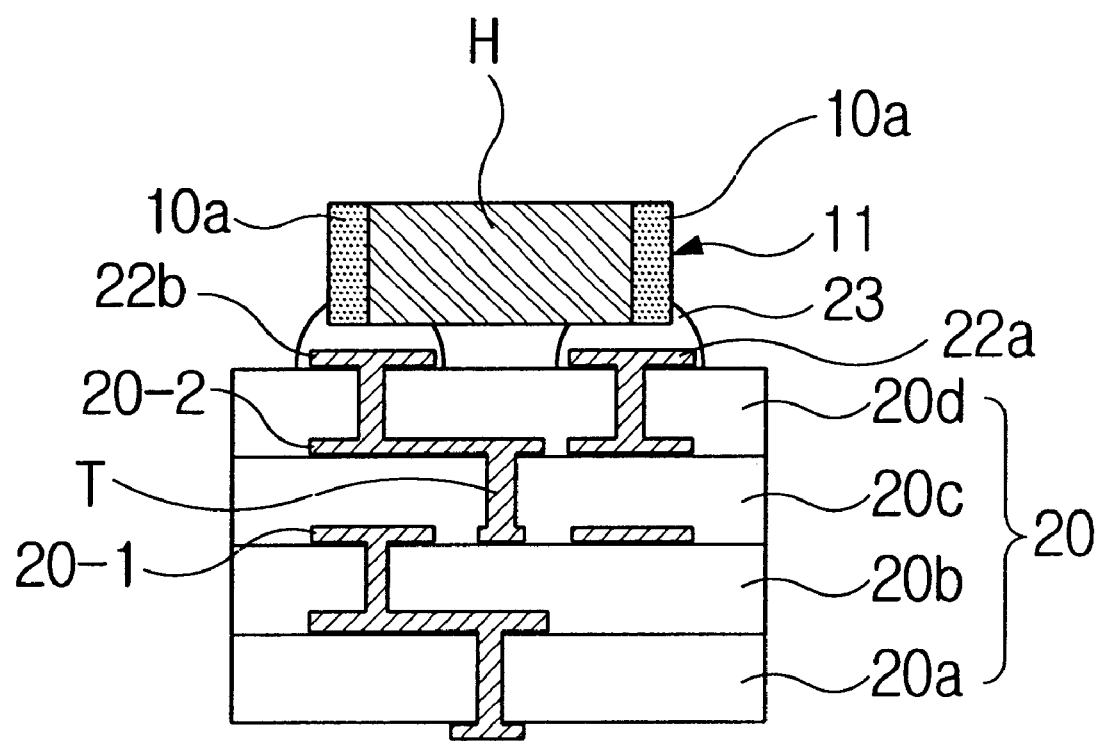
FIG. 4 is a cross-sectional view taken along a line IV–IV' of FIG. 2.

FIG. 4 is a cross-sectional view taken along the line IV–IV' of FIG. 2, which is illustrated the cross-sectional view of multiple line grid array package. As shown in FIG. 4, a package body 20 includes four layers 20a, 20b, 20c, and 20d, each of which comprises a nonconductive substrate, and metallic electrode line 20-1, 20-2, and the via holes. The top layer 20d further includes input/output nodes 22 on the surface thereof. On the bottom surface of the lowest layer 20a there is provided bottom pattern (refer to FIG. 5A). On the top surface of the most top layer 20d there is also provided a top pattern (refer to FIG. 5B). The top pattern includes a plurality of input/output nodes 22 which are electrically connected to the corresponding conductors of the multiple line grid 11.

Each of the package layers is heat-adhered each other by pressure and the via holes are filled with conductive paste T. On the upper face of each of the package layers 20a, 20b, 20c, 20d, there are printed a number of electrodes 20-1, 20-2. And the input/output nodes 22 are exposed to the upper face of the package body 20.

According to the present invention, one multiple line grid 11 is connected with the same number of the input/output nodes 22 as that of the conductors 10a which are formed on the outer sides or interior of the multiple line grid 11. That is, for example, in this embodiment FIG. 3A, since four grooves H are formed on the outer sides of one multiple line grid 11 in the form of rectangular disc, the multiple line grid 11 can be connected with eight input/output nodes 22. At this time, the input/output nodes 22 are bonded to the conductor 10a coated on the outer sides of the multiple line grid 11 by solder 23, as shown in FIG. 4, and the multiple line grid 11 is thereby bonded to but is otherwise freestanding on the surface of its package body. Although two nodes 22 are shown in FIG. 4, the multiple line grid 11 is connected to the same number of the input/output nodes 22 as those of the conductors 10a which are formed on the outer sides of the multiple line grid 11, as described above. The multiple line grid according to the present invention may be applied to array type packages, chip scale packages, flip chip packages, wafer level packages, and connectors.

Figure 5A:
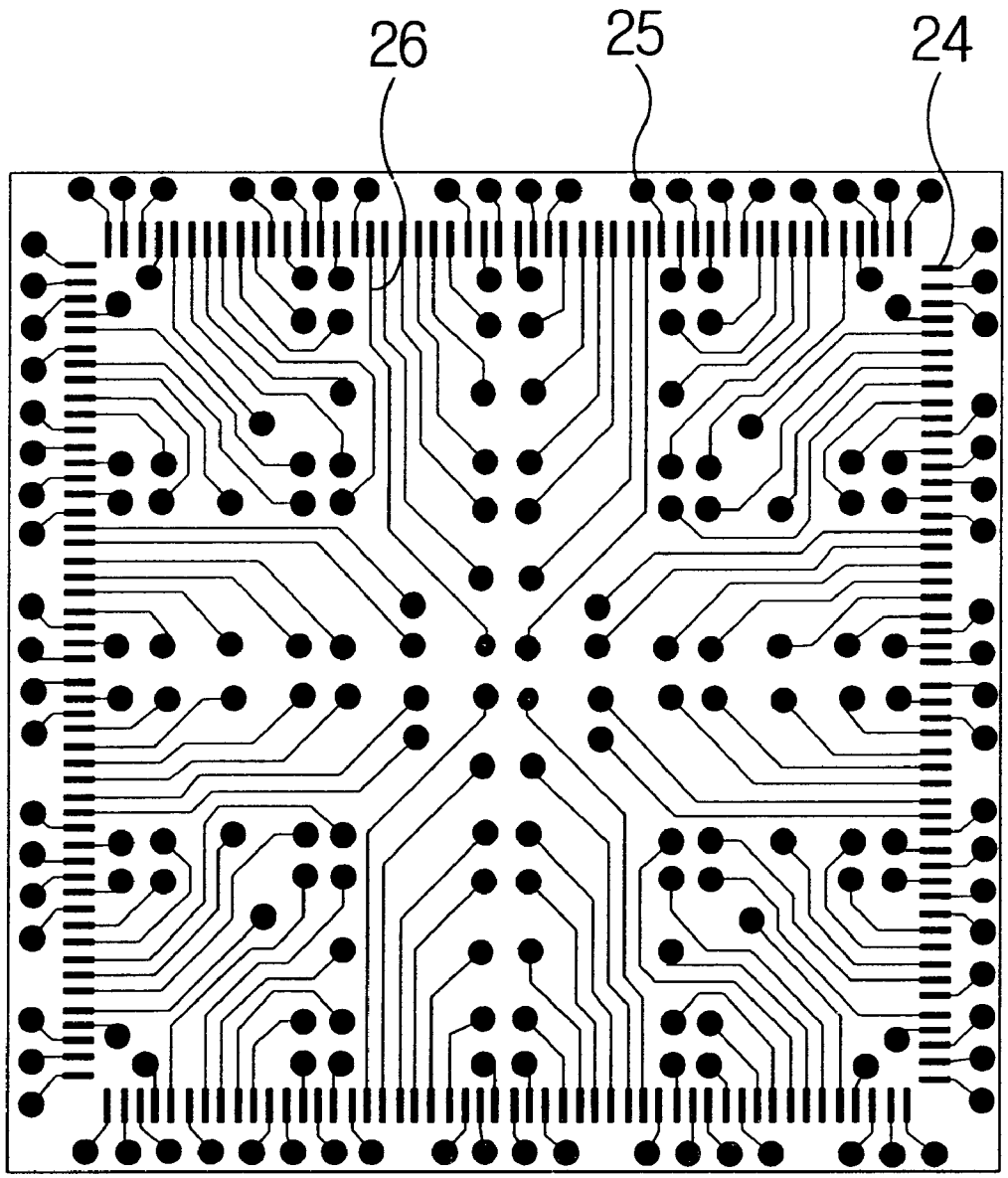
FIGS. 5A to 5B are plan views showing examples of electrical circuit patterns printed on bottom and top surfaces of the package body, respectively.
Figure 5B:
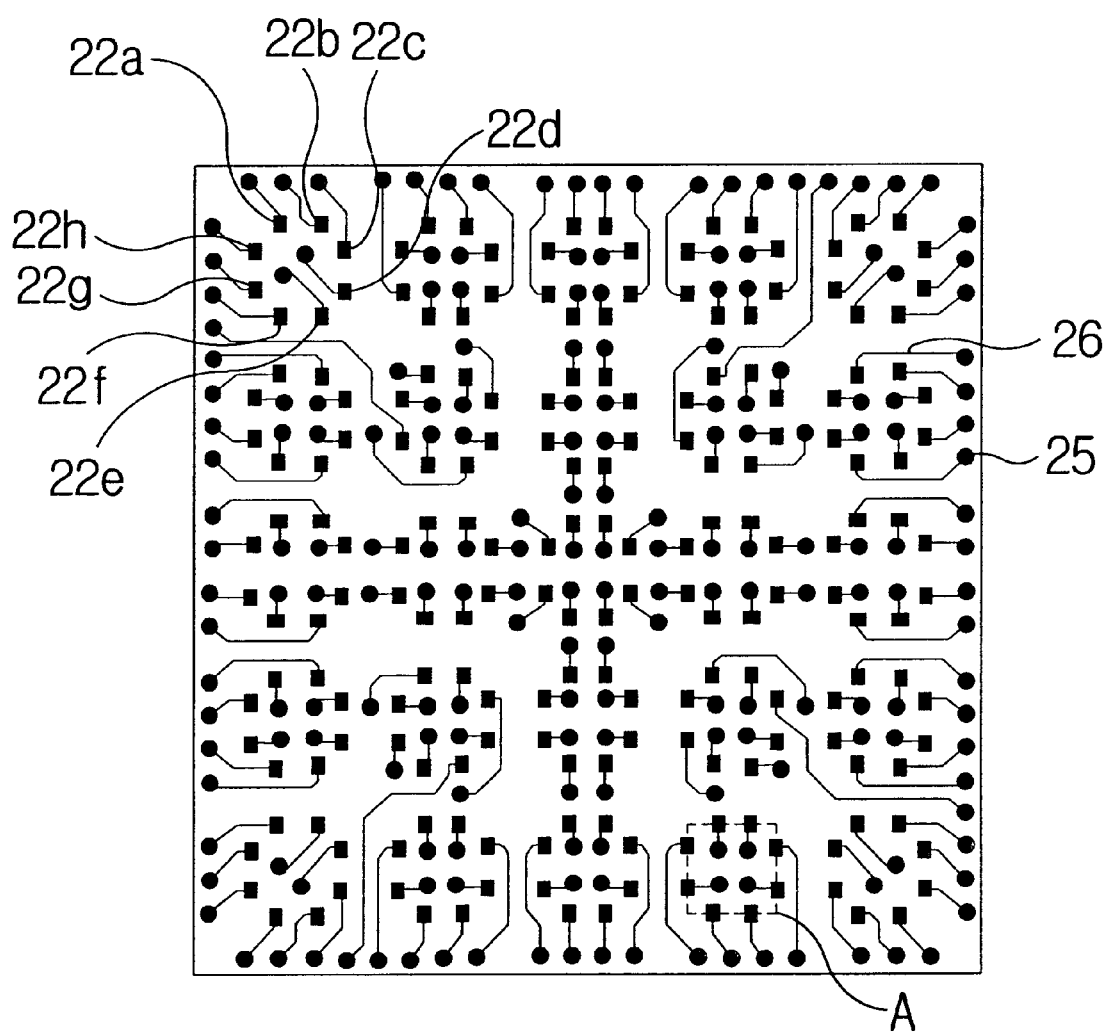

FIGS. 5A and 5B are plan views showing electrical circuit patterns printed on bottom and top surfaces of the package body, respectively. The electrical circuit patterns on the package body 20 can be of various forms depending on the types of multiple line grid 11 and IC chips used. One example of such patterns are described in the following.

The most bottom layer of the package body 20 has a nonconductive substrate and a pattern on the surface of the substrate as shown in FIG. 5A. The pattern includes a number of wire bond pads 24, via hole pads 25, and electrode lines 26. The number of wire bond pads 24 are formed such that the package body 20 is connected to the semiconductor chip by a wire bonding or other connecting methods such as redistribution for wafer level packaging method and C4 (Controlled Collapsed Chip Connection) method. The number of via hole pads 25 serve as providing the electrical connection between the package layers and the electrode lines 26 function as providing the electrical connection between the input/output nodes 22, the wire bond pads 24 and the via hole pads 25. The wire bond pads may be located on any area of the package body 20.

The pattern shown in FIG. 5B is will be described hereinafter. The pattern shown in FIG. 5B is not limited but illustrative.

The electrical circuit pattern is designed by the following design rules.

For example, in the case that the multiple line grid includes eight conductors, input/output nodes 22 are, as shown in FIG. 5B, formed in such manner that each of the input/output nodes 22 corresponds to each of the conductors 10a of the multiple line grid 11. The conductors 10a and input/output nodes 22 are connected by soldering.

As shown in FIG. 5B, the configuration of the input/output nodes 22 forms rectangular shape. Besides, the configuration of the input/output nodes may form various shapes such as triangular shape, etc. and may have various sizes depending on the shape and the size of the multiple line grid 11. Some of the via hole pads 25 and the electrode lines 26 are positioned outside an area [A] where the multiple line grid 11 is located and the other of the hole pads and the electrode lines 26 are positioned within an area [A] where the multiple line grid is located. Alternatively, all via hole pads and electrode lines may be positioned within an area [A] where the multiple line grid is located.

For example, when the design rules of the FIG. 5A and FIG. 5B are such that at most two electrode lines are placed between the two adjacent multiple line grids 11, the input/output node pitch is about 500 micrometers, the via hole diameter is about 200 micrometers, line width and spacing is about 75 micrometers and each of the input/output nodes 22 of rectangular shape has a dimension of about 200 micrometer×200 micrometer, then 200 input/output nodes 22 can be placed in the package body with two package layers and the dimensions of the package body is about 9.8 millimeters×9.8 millimeters. This kind of the design rules results in the lower manufacturing cost than any other package design, while giving the smaller package substrate area and footprint area on PCB. When the multiple line grid array package is surface-mounted on the printed circuit board and the input/output nodes 22 are connected to the input/output nodes 22 on the printed circuit board, the design rules for circuit patterns on the printed circuit board will be the same as the design rules aforementioned.

The patterns described in the present invention may be applied to other types of plastic and ceramic packages such as [QFP,] BGA, CSP (Chip Scale Packages) and wafer level packages. The patterns described in this invention may be also applied to PCB (Printed Circuit Board) and ceramic substrate for hybrid ICs.

Besides, the pattern design described in the present invention can also be applied to conventional PCB pattern design.

According to the pattern in the present invention, a number of input/output nodes are arranged within small area and the signal delivery delay is prevented due to the reduction of the length of the electrode lines.

Figure 6A:
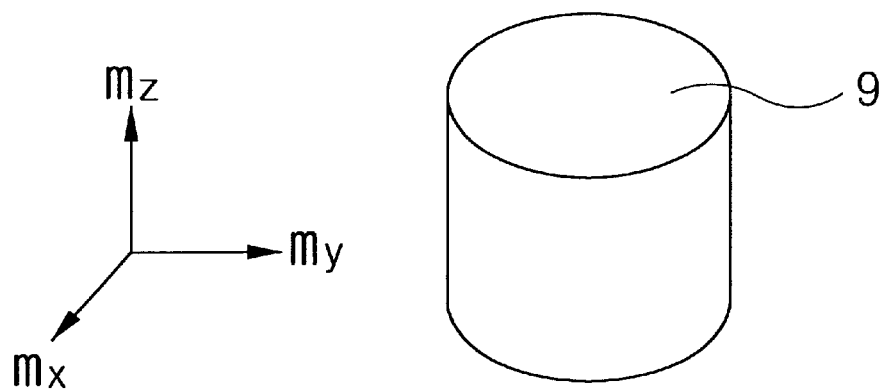
FIGS. 6A and 6C are schematic perspective views showing one of methods of manufacturing the multiple line grid according to this invention.
Figure 6B:
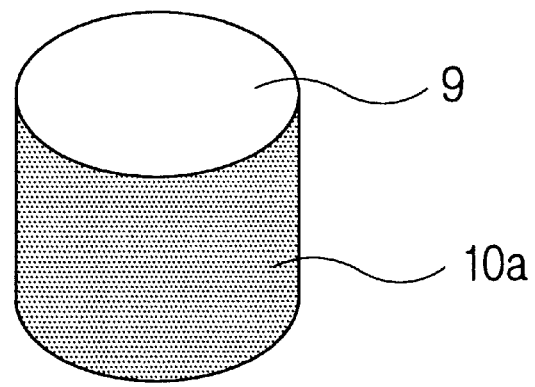
Figure 6C:
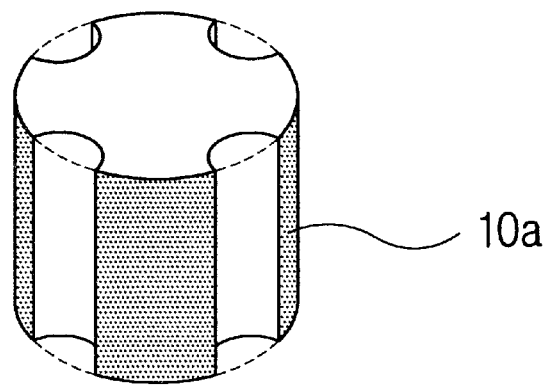

Referring to FIGS. 6A to 6C. the method for manufacturing the one type of multiple line grid used in multiple line grid array package in accordance with one embodiment of the present invention is to be explained hereinafter.

First, for example, a multiple line grid body 9 of circular disc is formed of a nonconductive material such as ceramic and plastic as shown in FIG. 6A. In addition, the circular disc 9 can be formed into a cylindrical shape in which its height $m_z$ is longer than its diameter ($m_x$, $m_y$.)

Secondly, the conductor 10a is coated on the outer side around the circular disc 9, as shown in FIG. 6B. The conductor 10a can be formed on the outer side of the circular disc 9 in a manner of, for example, the electroless plating, conductive paste coating, or conductive paste filling.

Finally, as shown in FIG. 6C, a number of grooves H and a number of conductors 10a parallel to the longitudinal direction $m_z$ are formed on the outer side of the circular disc 9 by a cutting process such as diamond saw cutting, laser cutting, ultrasonic cutting or punching, thereby being formed the multiple line grid 11 connected to a number of the input/output nodes 22. In this embodiment, the order of the steps of forming the conductor 10 and forming the grooves H parallel to the axial direction $m_z$ on the outer side of the circular disc 9 can be reversed.

Therefore, since a number of the grooves H parallel to the axial direction $m_z$ are formed on the outer side of the multiple line grid 11, the conductor 10a coated on the outer side of the multiple line grid 11 are separated independently from each other by the inner portion of the nonconductive circular disc 9. Each of such insulated conductors 10a is a I/O path to be connected to a single node. One multiple line grid 11 is connected with a number of nodes.

Furthermore, in the method of forming the multiple line grid according to the present invention, the multiple line grid 11 may be formed of a ceramic, a polymer, a silicon, or a compound of ceramic and plastic material.

According to the present invention, although the multiple line grid used in the multiple line grid array package is described in the form of the rectangular or circular disc in the preferred embodiments, the multiple line grid can also have various shapes such as a cylinder, an elliptical disc, a hexahedron disc and cylindrical types of aforementioned shapes.

Moreover, the package body can be formed of a plastic and/or ceramic structures.

As described above in detail, according to the present invention, one multiple line grid can be connected with a number of the input/output nodes, whereby the number of lead pins can be reduced considerably.

Accordingly, the present invention has the advantage of reducing the manufacturing cost as well as the size of package.

Furthermore, in order to connect the input/output nodes with the multiple line grid of the invention, the soldering process is applied instead of the brazing process, thereby further reducing the manufacturing cost.

The single multiple line grid of the invention can be connected with a number of the input/output nodes, whereby it can be facilely applied to the highly integrated semiconductor packages.

Having described the preferred embodiments of the present invention, it will appear to those ordinary skilled in the art that various modifications may be made to the disclosed embodiments, and that such modifications are intended to be within the scope of the present invention.

What is claimed is:

1. A multiple line grid array package, comprising:
   a package body having a surface;
   a pattern formed on the surface of the package body and including a number of input/output nodes; and
   a plurality of multiple line grids, each multiple line grid having a nonconductive grid body and a number of conductors formed parallel to a longitudinal direction of the nonconductive grid body on an outer peripheral portion and/or within an inner portion of the multiple line grid body and bonded to the package body, wherein each of the conductors is electrically isolated from each other and matches a corresponding one of the number of input/output nodes of the pattern, wherein the multiple line grid array package is for surface mounting.

2. The package according to claim 1, wherein the package body includes at least one layer.

3. The package according to claim 2, wherein the layer comprises a ceramic layer, a polymeric layer, or a composite layer of ceramics and polymers.

4. The package according to claim 1, wherein the nonconductive grid body of the multiple line grid is selected from the group consisting of a ceramic, a polymer, a composite material of ceramics and polymers, and silicon.

5. The package according to claim 1, wherein the multiple line grid is formed into one of a rectangular disc, a circular disc, a cylinder, an elliptical disc, a hexahedron disc and a cylinder.

6. The package according to claim 5, wherein a height of the multiple line grid body is the same as a width of the multiple line grid body or longer than said width.

7. The package according to claim 4, wherein a height of the multiple line grid body is shorter than a width of the multiple line grid body.

8. The package to claim 1, wherein the package body comprises at least two layers selected from the group consisting of a ceramic layer, a polymer layer, a composite layer of ceramics and polymers.

9. the package according to claim 1, wherein the first pattern formed on the first surface of the package comprises a number of electrode lines, wire bond pads, and via hole pads and input/output nodes.

10. The package according to claim 1, wherein each of the conductors is bonded to the corresponding input/output node by soldering.

11. The package according to claim 9, wherein the input/output nodes form various configurations in the first pattern depending on the position of the corresponding conductors of the multiple line grid, some of the number of electrode lines are positioned in the first pattern within an area where the multiple line grid is located and others of the number of electrode lines are positioned in the first pattern outside the area where the multiple line grid is located, some of the number of via hole pads are positioned in the first pattern within the area where the multiple line grid is located, and others of the number of via hole pads are positioned in the first pattern outside the area where the multiple line grid is located.

12. The package according to claim 9, wherein the input/output nodes form various configurations in the first pattern depending on positioning of the corresponding conductors of the multiple line grid, and all the electrode lines and via hole pads are positioned in the first pattern within an area where the multiple line grid is located.

13. The pattern described in claim 11, wherein the pattern is applicable to BGA, CSP, flip chip packages and wafer level packages, printed circuit board and ceramic substrate for hybrid ICs.

14. The pattern described in claim 12, wherein the pattern is applicable to BGA, CSP, flip chip packages and wafer level packages, printed circuit board and ceramic substrate for hybrid ICs.

15. The multiple line grid described in claim 1, wherein the multiple line grid is applicable to array type packages, chip scale packages, flip chip packages, wafer level packages, and connectors.

16. The package body of claim 1, wherein said multiple line grid array package is for surface mounting on a printed circuit board.

17. The multiple line grid array package of claim 1, wherein said multiple line grid has a flat end surface.

18. A package body having nodes on a surface of said package body with electrical conductors mounted on said nodes, characterized by a plurality of multiple line grids (11) mounted on said nodes on said surface of said package body, by each multiple line grid having a plurality of conductors (10a) having positions on or in a grid body (9) that insulates said conductors from each other, by each multiple line grid located on a plurality of nodes (22) arranged in a corresponding area (A) of said surface, by said plurality of nodes in said area having a arrangement matching said positions of said conductors on or in said grid body, and by said grid body freestanding on bonds (23) on said package body connecting conductors of said multiple line grid and matching nodes in said corresponding area of said surface.

19. The package body of claim 18, characterized by a plurality of areas of nodes having said arrangement forming a pattern on said surface of said package body, by said plurality of multiple line grids extending from said surface for surface mounting said grids to a same pattern of nodes on a surface of another device.

20. The package body of claim 18, characterized by solder bonds (23).

21. The package body of claim 18, characterized by a plurality of package layers (20a, 20b, 20c, 20d) with an electronic device mounted on an inner layer and occupying a cavity (21) within one or more surrounding layers of said package layers, said inner layer having metallic electrode lines (20-1) on a face thereof connected to said electronic device and connected with a conductive material (T) in holes through said package layers to said nodes (22) on said surface on an outer layer of said package body, by a plurality of areas of nodes having said arrangement forming a pattern on said surface on said outer layer of said package body, by said plurality of multiple line grids (11) arrayed on said surface on said outer layer of said package body, and by said array of multiple line grids extending away from said surface of said outer layer for surface mounted bonding to an external device on nodes arranged in a same pattern on said external device as formed on said surface on said outer layer of said package body.

22. The package body of claim 18, characterized by said each multiple line grid having a nonconductive grid body.

23. The package body of claim 18, characterized by said plurality of package layers adhered to each other by heat and pressure.

24. The package body of claim 18, characterized by said grid body having a rectangular form with grooves (H) to separate said conductors on a surface of said grid body along a height axis (nz) of said grid body.

25. The package body of claim 18, characterized by said grid body having a cylindrical form with grooves (H) to separate said conductors on a surface of said grid body along a height axis (nz) of said grid body.

26. The package body of claim 18, characterized by said grid body as a disc.

27. The package body of claim 18, characterized by said grid body as a rod.

28. The package body of claim 18, characterized by said grid body having a form with holes through said grid body along a height axis of said grid body with conductors on inner walls of said holes.

29. The package body of claim 18, characterized by said grid body having a form with grooves around a periphery and along a height axis (nz) of said grid body with conductors on inner walls of said grooves.

30. The package body of claim 18, said grid body characterized by various forms having an aspect ratio defined by a ratio of dimensions along width (nx, ny) and height (nz) axes.

31. The package body of claim 18, characterized by said grid body having an elliptical disc form.

32. The package body of claim 18, characterized by said grid body having a hexahehedron disc form.

33. The package body of claim 18, characterized by via hole pads and electrodes positioned both outside and within said area on said surface.

34. The package body of claim 18, characterized by said multiple line grid bonded (23) to a matching one of said nodes in said corresponding area by solder.

35. The package body of claim 18, characterized by said multiple line grid having a flat end extending from said surface of said package body.

* * * * *